(12) United States Patent
Kwak

(10) Patent No.: US 10,658,019 B2
(45) Date of Patent: May 19, 2020

(54) CIRCUIT, SYSTEM AND METHOD FOR CONTROLLING READ LATENCY

(71) Applicant: Micron Technology, Inc., Boise, ID (US)

(72) Inventor: Jongtae Kwak, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/636,447

(22) Filed: Mar. 3, 2015

(65) Prior Publication Data

US 2015/0170725 A1 Jun. 18, 2015

Related U.S. Application Data

(63) Continuation of application No. 13/212,015, filed on Aug. 17, 2011, now Pat. No. 8,988,966, which is a
(Continued)

(51) Int. Cl.
*G11C 7/00* (2006.01)
*G11C 7/22* (2006.01)
(Continued)

(52) U.S. Cl.
CPC .............. *G11C 7/222* (2013.01); *G11C 7/106* (2013.01); *G11C 7/1051* (2013.01); *G11C 7/1066* (2013.01); *G11C 7/22* (2013.01); *H03K 3/012* (2013.01); *H03K 3/0375* (2013.01); *H03L 7/0814* (2013.01); *H03L 7/181* (2013.01)

(58) Field of Classification Search
CPC ... G11C 11/418; G11C 11/419; G11C 7/1018; G11C 7/1075; G11C 7/222; G11C 7/1051; G11C 7/106; G11C 7/1066; G11C 7/22; H03K 3/012; H03K 3/0375
USPC ............ 365/154, 194, 230.058, 230.08, 233, 365/189.05, 226
See application file for complete search history.

(56) References Cited

U.S. PATENT DOCUMENTS

| 4,644,248 A | 2/1987 | Brennen et al. |
| 5,004,933 A | 4/1991 | Widener |

(Continued)

FOREIGN PATENT DOCUMENTS

| CN | 1952868 A | 4/2007 |
| CN | 101752009 A | 6/2010 |

(Continued)

OTHER PUBLICATIONS

"Interfacing DDR SDRAM with Stratix II Devices", Version 3.2, Altera Corp, Sep. 2008.
(Continued)

*Primary Examiner* — Connie C Yoha
(74) *Attorney, Agent, or Firm* — Dorsey & Whitney LLP

(57) ABSTRACT

A read latency control circuit is described having a clock synchronization circuit and a read latency control circuit. The clock synchronization circuit includes an adjustable delay line to generate an output clock signal whose phase is synchronized with the phase of the input clock signal. The read latency control circuit captures a read command signal relative to the timing of the input clock signal and outputs the read command signal relative to the timing of the output clock signal such that the read command signal is outputted indicative of a specified read latency.

15 Claims, 6 Drawing Sheets

Related U.S. Application Data continuation of application No. 12/683,309, filed on Jan. 6, 2010, now Pat. No. 8,018,791, which is a continuation of application No. 11/724,910, filed on Mar. 15, 2007, now Pat. No. 7,656,745.

(51) Int. Cl.
| | |
|---|---|
| *G11C 7/10* | (2006.01) |
| *H03L 7/081* | (2006.01) |
| *H03K 3/012* | (2006.01) |
| *H03K 3/037* | (2006.01) |
| *H03L 7/181* | (2006.01) |

(56) References Cited

U.S. PATENT DOCUMENTS

| | | |
|---|---|---|
| 5,610,558 A | 3/1997 | Mittel et al. |
| 5,935,253 A | 8/1999 | Conary et al. |
| 5,959,900 A | 9/1999 | Matsubara |
| 6,111,810 A | 8/2000 | Fujita |
| 6,198,689 B1 | 3/2001 | Yamazaki et al. |
| 6,219,384 B1 | 4/2001 | Kliza et al. |
| 6,240,045 B1 | 5/2001 | Haraguchi et al. |
| 6,260,128 B1 | 7/2001 | Ohshima et al. |
| 6,269,050 B1 | 7/2001 | Kwon et al. |
| 6,275,077 B1 | 8/2001 | Tobin et al. |
| 6,292,040 B1 | 9/2001 | Iwamoto et al. |
| 6,295,245 B1 | 9/2001 | Tomita et al. |
| 6,327,318 B1 | 12/2001 | Bhullar et al. |
| 6,424,592 B1 | 7/2002 | Maruyama |
| 6,438,055 B1 | 8/2002 | Taguchi et al. |
| 6,449,674 B1 | 9/2002 | Yun et al. |
| 6,459,313 B1 | 10/2002 | Godbee et al. |
| 6,489,823 B2 | 12/2002 | Iwamoto |
| 6,510,095 B1 | 1/2003 | Matsuzaki et al. |
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,759,881 B2 | 7/2004 | Kizer et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,868,504 B1 | 3/2005 | Lin |
| 6,885,252 B2 | 4/2005 | Hsu |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,158,443 B2 | 1/2007 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,319,728 B2 | 1/2008 | Bell et al. |
| 7,336,752 B2 | 2/2008 | Vlasenko et al. |
| 7,340,632 B2 | 3/2008 | Park |
| 7,355,464 B2 | 4/2008 | Lee |
| 7,375,560 B2 | 5/2008 | Lee et al. |
| 7,411,852 B2 | 8/2008 | Nishioka et al. |
| 7,428,284 B2 | 9/2008 | Lin |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,541,851 B2 | 6/2009 | Gomm et al. |
| 7,580,321 B2 | 8/2009 | Fujisawa et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,675,791 B2 * | 3/2010 | Kim ............... G11C 7/1072 365/189.05 |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 * | 8/2010 | Cho ............... G11C 7/1051 365/194 |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,876,640 B2 | 1/2011 | Lin |
| 7,885,365 B2 | 2/2011 | Hagleitner et al. |
| 7,913,103 B2 | 3/2011 | Gold et al. |
| 7,928,782 B2 | 4/2011 | Booth et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,970,090 B1 | 6/2011 | Tetzlaff |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,536,915 B1 | 9/2013 | Terrovitis |
| 8,644,096 B2 | 2/2014 | Bringivijayaraghavan |
| 8,717,078 B2 | 5/2014 | Idgunji et al. |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 9,508,409 B2 | 11/2016 | Kwak |
| 9,529,379 B2 | 12/2016 | Kwak |
| 9,530,473 B2 | 12/2016 | Mazumder |
| 9,531,363 B2 | 12/2016 | Miyano |
| 9,601,170 B1 | 3/2017 | Mazumder et al. |
| 9,813,067 B2 | 11/2017 | Ma et al. |
| 9,865,317 B2 * | 1/2018 | Ishibashi ............... G11C 7/1057 |
| 10,193,558 B2 | 1/2019 | Ma et al. |
| 10,224,938 B2 | 3/2019 | Takahashi |
| 10,290,336 B2 | 5/2019 | Ishibashi et al. |
| 2001/0015924 A1 | 8/2001 | Arimoto et al. |
| 2002/0027451 A1 | 3/2002 | Shinozaki |
| 2002/0054515 A1 | 5/2002 | Kang |
| 2002/0057624 A1 | 5/2002 | Manning |
| 2002/0085427 A1 | 7/2002 | Yi |
| 2002/0087750 A1 | 7/2002 | Yi |
| 2002/0110035 A1 * | 8/2002 | Li ............... G11C 5/14 365/227 |
| 2002/0149506 A1 | 10/2002 | Altrichter et al. |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2004/0000934 A1 | 1/2004 | Jeon |

(56) References Cited

U.S. PATENT DOCUMENTS

| | | |
|---|---|---|
| 2004/0008064 A1 | 1/2004 | Kashiwazaki |
| 2004/0041604 A1 | 3/2004 | Kizer et al. |
| 2005/0017774 A1 | 1/2005 | Chow et al. |
| 2005/0024107 A1 | 2/2005 | Takai et al. |
| 2005/0047222 A1 | 3/2005 | Rentschler |
| 2005/0052309 A1 | 3/2005 | Wang |
| 2005/0058012 A1 | 3/2005 | Yamauchi et al. |
| 2005/0132043 A1 | 6/2005 | Wang et al. |
| 2005/0184780 A1 | 8/2005 | Chun |
| 2005/0270852 A1* | 12/2005 | Dietrich et al. ......... 365/189.01 |
| 2006/0033542 A1 | 2/2006 | Lin et al. |
| 2006/0055441 A1 | 3/2006 | Mcclannahan et al. |
| 2006/0062341 A1 | 3/2006 | Edmondson et al. |
| 2006/0064620 A1 | 3/2006 | Kuhn et al. |
| 2006/0077751 A1* | 4/2006 | Oh .................... G11C 7/1051 365/232 |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2006/0250861 A1* | 11/2006 | Park .................... G11C 7/1051 365/193 |
| 2006/0250883 A1* | 11/2006 | Szczypinski ......... G11C 7/1066 365/189.05 |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0042705 A1 | 2/2008 | Kim et al. |
| 2008/0056019 A1* | 3/2008 | Kim .................... G11C 7/22 365/189.05 |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0180144 A1* | 7/2008 | Mai .................... H03L 7/0812 327/157 |
| 2008/0204071 A1 | 8/2008 | Lee et al. |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0219068 A1 | 9/2009 | Mizuhashi et al. |
| 2009/0232250 A1 | 9/2009 | Yamada et al. |
| 2009/0290445 A1 | 11/2009 | Kinoshita et al. |
| 2009/0315600 A1 | 12/2009 | Becker et al. |
| 2010/0001762 A1 | 1/2010 | Kim |
| 2010/0052739 A1 | 3/2010 | Shibata |
| 2010/0054060 A1 | 3/2010 | Ku |
| 2010/0058261 A1 | 3/2010 | Markov et al. |
| 2010/0066422 A1 | 3/2010 | Tsai |
| 2010/0124090 A1 | 5/2010 | Arai |
| 2010/0124102 A1 | 5/2010 | Lee et al. |
| 2010/0128543 A1 | 5/2010 | Kwon et al. |
| 2010/0142308 A1 | 6/2010 | Kim |
| 2010/0165769 A1 | 7/2010 | Kuroki |
| 2010/0165780 A1 | 7/2010 | Bains et al. |
| 2010/0177589 A1 | 7/2010 | Kinoshita |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0295584 A1 | 11/2010 | Sano |
| 2010/0327926 A1 | 12/2010 | Takahashi |
| 2011/0026318 A1 | 2/2011 | Franceschini et al. |
| 2011/0047319 A1 | 2/2011 | Jeon et al. |
| 2011/0055671 A1 | 3/2011 | Kim et al. |
| 2011/0057697 A1 | 3/2011 | Miyano |
| 2011/0058437 A1 | 3/2011 | Miyano |
| 2011/0102039 A1 | 5/2011 | Shin |
| 2011/0161732 A1 | 6/2011 | Park |
| 2011/0169501 A1 | 7/2011 | Sato |
| 2011/0194575 A1 | 8/2011 | Chen et al. |
| 2011/0228625 A1 | 9/2011 | Bringivijayaraghavan |
| 2011/0238866 A1 | 9/2011 | Zitlaw |
| 2011/0238941 A1 | 9/2011 | Xu et al. |
| 2011/0298505 A1 | 12/2011 | Khoury et al. |
| 2011/0298512 A1 | 12/2011 | Kwak |
| 2011/0304365 A1 | 12/2011 | Bunch |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2012/0306580 A1 | 12/2012 | Ellis |
| 2013/0002318 A1 | 1/2013 | Lu et al. |
| 2013/0002320 A1 | 1/2013 | Lin et al. |
| 2013/0021106 A1 | 1/2013 | Bracmard et al. |
| 2013/0141994 A1 | 6/2013 | Ito et al. |
| 2013/0194013 A1 | 8/2013 | Kwak |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0177361 A1 | 6/2014 | Kitagawa |
| 2014/0258764 A1 | 9/2014 | Kwak |
| 2014/0293719 A1 | 10/2014 | Jung |
| 2014/0340158 A1 | 11/2014 | Thandri et al. |
| 2015/0097604 A1 | 4/2015 | Taniguchi |
| 2015/0156009 A1 | 6/2015 | Bogdan |
| 2015/0235691 A1 | 8/2015 | Kwak |
| 2015/0263739 A1 | 9/2015 | Jung et al. |
| 2015/0263740 A1 | 9/2015 | Jung et al. |
| 2015/0340072 A1 | 11/2015 | Mazumder |
| 2016/0013799 A1 | 1/2016 | Li et al. |
| 2016/0056807 A1 | 2/2016 | Neidengard et al. |
| 2016/0308491 A1 | 10/2016 | Elgaard |
| 2016/0365860 A1 | 12/2016 | Ma et al. |
| 2017/0288682 A1 | 10/2017 | Ma et al. |
| 2017/0309320 A1 | 10/2017 | Ishibashi et al. |
| 2017/0309323 A1 | 10/2017 | Ishibashi et al. |
| 2018/0053538 A1 | 2/2018 | Miyano et al. |
| 2018/0054336 A1 | 2/2018 | Hori et al. |
| 2018/0238945 A1 | 8/2018 | Buck et al. |
| 2018/0286470 A1 | 10/2018 | Miyano et al. |
| 2018/0358064 A1 | 12/2018 | Ishibashi et al. |
| 2018/0364752 A1 | 12/2018 | Li et al. |
| 2019/0036535 A1 | 1/2019 | Takahashi |
| 2019/0302245 A1 | 10/2019 | Loinaz |
| 2019/0305865 A1 | 10/2019 | Loinaz |
| 2019/0360911 A1 | 11/2019 | Loinaz |

FOREIGN PATENT DOCUMENTS

| | | |
|---|---|---|
| JP | 2013-222997 A | 10/2013 |
| TW | 201303735 | 1/2013 |
| WO | 2017189127 A1 | 2/2017 |
| WO | 2018038835 A1 | 3/2018 |

OTHER PUBLICATIONS

Lee "How to Implement DDR SGRAM in Graphic System", Samsung Electric, 4Q1998.

Second Office Action received for KR Appln No. 10-2013-7027649 dated Sep. 15, 2015.

Second Office Action received for CN Appl. 201280016714.0 dated Oct. 10, 2015.

(56) References Cited

OTHER PUBLICATIONS

U.S. Appl. No. 14/698,550, entitled "Methods and Apparatuses Including Command Latency Control Circuit", filed Apr. 28, 2015, pp. all.
U.S. Appl. No. 15/139,102, entitled "Methods and Apparatuses Including Command Delay Adjustment Circuit", filed Apr. 26, 2016, pp. all.
U.S. Appl. No. 15/139,120, entitled "Apparatuses and Methods for Adjusting a Delay of a Command Signal Path", filed Apr. 26, 2016, pp. all.
U.S. Appl. No. 15/243,651, entitled "Apparatuses and Methods for Adjusting Delay of Command Signal Path", filed Aug. 22, 2016, pp. all.
U.S. Appl. No. 15/660,405, entitled "Apparatuses and Methods For Indirectly Detecting Phase Variations", filed Jul. 26, 2017; pp. all.
U.S. Appl. No. 16/286,829, titled "Apparatuses and Methods For Indirectly Detecting Phase Variations" filed Feb. 27, 2019, pp. all.

\* cited by examiner

CIRCUIT, SYSTEM AND METHOD FOR CONTROLLING READ LATENCY

CROSS-REFERENCE TO RELATED APPLICATION

This application is a continuation of pending U.S. patent application Ser. No. 13/212,015 filed Aug. 17, 2011, which is a continuation of U.S. patent application Ser. No. 12/683,309, filed Jan. 6, 2010, and issued as U.S. Pat. No. 8,018,791 on Sep. 13, 2011, which is a continuation of U.S. patent application Ser. No. 11/724,910, filed Mar. 15, 2007, and issued as U.S. Pat. No. 7,656,745 on Feb. 2, 2010. These applications and patents are incorporated by reference herein in their entirety and for all purposes.

TECHNICAL FIELD

Embodiments of the invention relate to integrated circuits, and more specifically to controlling read latency of a memory device using a DLL loop.

BACKGROUND

Synchronous integrated circuits are clocked by an external clock signal and perform operations at predetermined times relative to the rising and falling edges of the external clock signal. For example, in dynamic random access memories ("DRAMs"), the timing of external signals, such as command, address and write data signals, is determined by the external clock signal, and the memory device must latch these signals at the proper times to successfully capture the signals. To latch these applied signals, an internal clock signal is developed in response to the external clock signal, and is conventionally applied to latches contained in the memory device to clock the external signals into the latches. The internal clock signal and external clock signal must be synchronized to ensure the latches are clocked at the proper times to successfully capture the external signals.

When a read request is made, a memory controller requesting the data expects data from the memory device to be available on a data bus within a predetermined read latency, which is usually a predetermined number of system clock cycles after the read request is made, e.g. eight external clock cycles. The memory device has its own internal clock system, which receives the external clock signal and develops from the external clock signal several different internal clock signals using a delay locked loop ("DLL"). Problems with maintaining read data latency arise in high speed DRAMs from the necessity to align data with the external clock using the internal clock signals generated by the DLL.

In order to meet a specified read latency the memory device must be able to count clock signals upon receiving a READ command and activate an output latch to provide the requested data relative to the read clock signal. The read clock is provided to the read latch with a desired phase relationship to the external system clock signal. During high speed operations, the amount of read clock delay relative to the read data valid time becomes essentially indeterminable, consequently making it very difficult to control the read clock signal to ensure a correct data output and a specified read latency measured in terms of external clock cycles.

One solution to these problems is disclosed in U.S. Pat. No. 6,687,185, which discloses synchronizing the variable timing of the internal clock signals derived from an external clock signal such that the read data and the read clock signal used to latch the read data arrive at the data latch in synchronism and with a specified read latency. With reference to FIG. 1, an external memory controller 102 supplies command and address signals C/A to a memory device 100 through a command/address buffer 112, which applies received buffered signals to either a command decoder 128 for decoding incoming commands from the memory controller 102 or an address decoder 132 for decoding incoming addresses from the memory controller 102. When a READ command is received, the command decoder 128 decodes the READ command and applies decoded signals to a read logic 136 control circuit that initiates a read operation on the memory array 140. The read logic 136 control circuit operates the memory array 140 to read out data from one or more memory addresses that are specified by an address received from the memory controller 102 and decoded by the address decoder 132.

The memory controller 102 additionally supplies an external clock signal EXTCLK to an input buffer 110 of the memory device 100. The input buffer 110 generates a buffered EXTCLK signal that is applied to a delay lock loop ("DLL") 120, which generates internal clock signals for the memory device 100, including the read clock signal RDCLK. As previously discussed, the RDCLK signal is used to drive a read latch 148 so that the requested read data from the memory array 140 is properly latched to the respective DQ pad in a timeframe that meets the specified read latency. The input buffer 110 also applies the buffered EXTCLK signal to drive the command decoder 128 and the read logic 136 control circuit to decode the command and address signals in a timely manner.

The command decoder 128 additionally generates a RDSTART signal that has a fixed timing relationship to the RDCLK signal. The RDSTART signal is generated to track any changes in the RDCLK timing, and is also used to synchronize the read data from the memory array 140. When a READ command is decoded by the command decoder 128 the RDSTART signal is applied to a slave delay circuit 124, which models the DLL 120 and causes its output signal to be slaved to the RDCLK signal from the DLL 120. Therefore, any timing variations imparted on the RDCLK signal by the DLL 120 are also applied to the RDSTART signal. The slave delay circuit 124 outputs a delayed RDSTART signal that is applied to a counter 144, which also receives a specified read latency value from a mode register 130. The specified latency value may be predetermined at the time of manufacture, or may be a value from the memory controller 102. The delayed RDSTART signal enables the counter 144 to count down from an initial value using the read clock signal to the predetermined count value that represents the specified read latency for the memory device 100. Upon completing the count, the counter 144 signals the read latch 148 to synchronize latching the read data relative to the RDCLK based on the specified read latency.

Since the amount of delay that must be imposed on the RDCLK signal relative to when the read data is made available is indeterminable during high speed operations, it is very difficult to ensure the data output is correct and the specified read latency is met even with model delay circuits such as the slave delay circuit 124. In order for the slave delay circuit 124 to impart to the RDSTART signal the same delay that the DLL 120 imparts to the EXTCLK signal, the entire DLL 120 must be precisely modeled and the delays must be accurately matched. As is known to those skilled in the art, DLL circuits are generally large and cumbersome within the memory device space. Therefore, the trade-off of having a slave delay circuit 124 that accurately replicates the delay of the DLL 120 is that chip space consumption is doubled.

If other delay variations must be accounted for, additional model circuits and other compensative circuitry may also be required, such as offset circuits or additional counters. Such other circuits have been utilized to synchronize the read clock and the read data access within specified latency requirements. For example U.S. Pat. No. 7,065,001 entitled Method and Apparatus for Initialization of Read Latency Tracking circuit in High-Speed DRAM, which is assigned to the same assignee as the present invention, discloses a method of synchronizing counters in two different clock domains by generating a start signal for tracking a running count of clock pulses of a read clock signal. The start signal is generated by an initialization circuitry that includes an offset calculation. Various timing variations to the read clock signal are compensated in a circuit that includes a DLL, I/O model circuits and four separate counter circuits. As the demand for smaller high-speed memory chips continue to increase, any additional circuitry on the memory chip leads to significant loss of valuable chip space. However, if the read data is not provided at the DQ with a precise read latency, due to mismatched timing variations, the data will be corrupted and unusable.

Therefore, there is a need for a DLL circuit that accurately maintains a specified read latency while achieving a read operation synchronized to a read clock signal, but that also reduces the consumption of chip area.

DETAILED DESCRIPTION

Embodiments of the present invention are directed to a read latency control circuit controlled by a DLL circuit. Certain details are set forth below to provide a sufficient understanding of the embodiments of the invention. However, it will be clear to one skilled in the art that the embodiments of the invention may be practiced without these particular details. In other instances, well-known circuits, control signals, and timing protocols have not been shown in detail in order to avoid unnecessarily obscuring the embodiments of the invention. Although the embodiments of the present description are directed to synchronous memory devices, the principles described herein are equally applicable to other types of synchronous integrated circuits.

Figure 1:
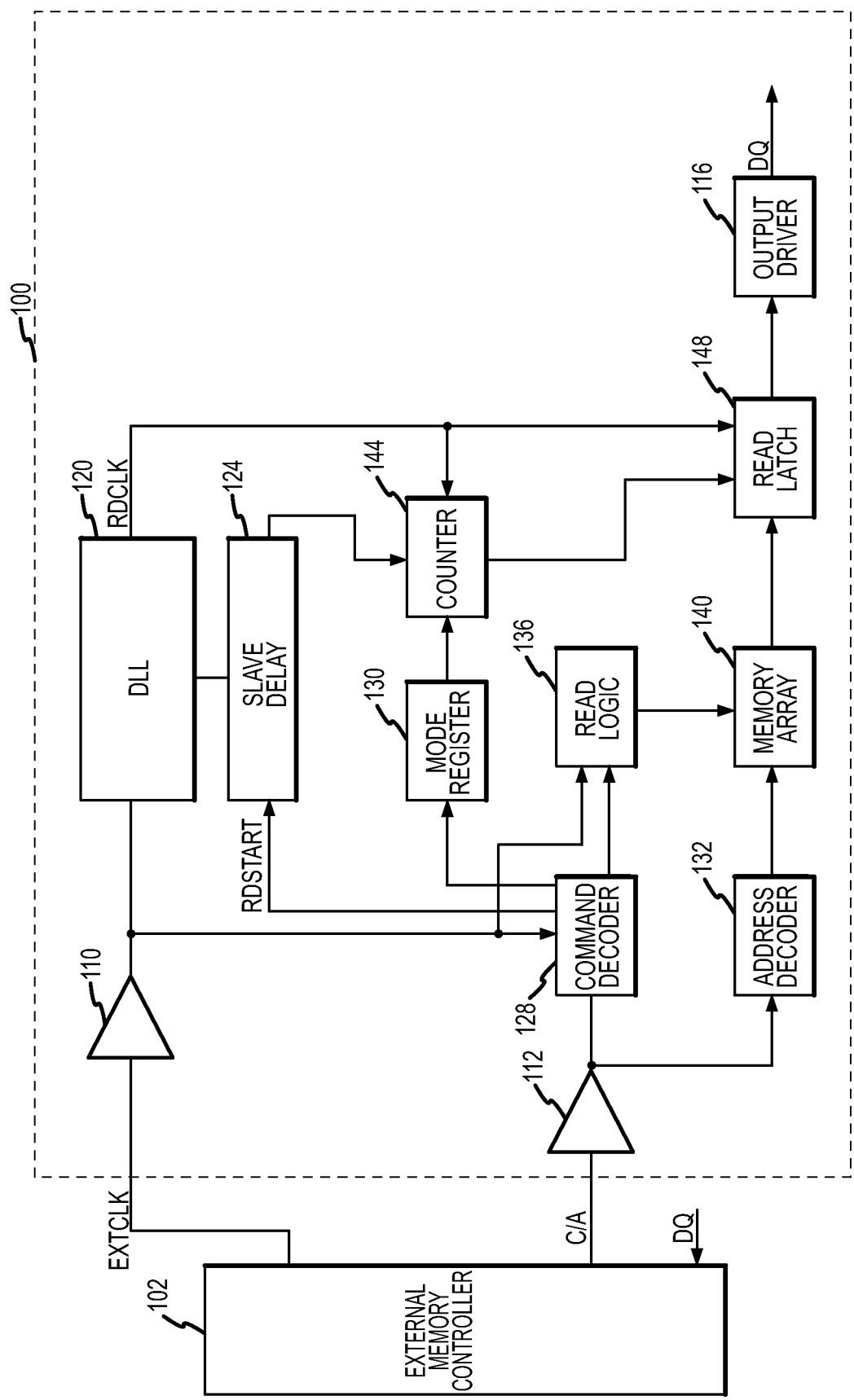
FIG. 1 is a block diagram of a prior art read latency tracking circuit having a DLL circuit and a slave circuit modeling the DLL circuit.
Figure 2:
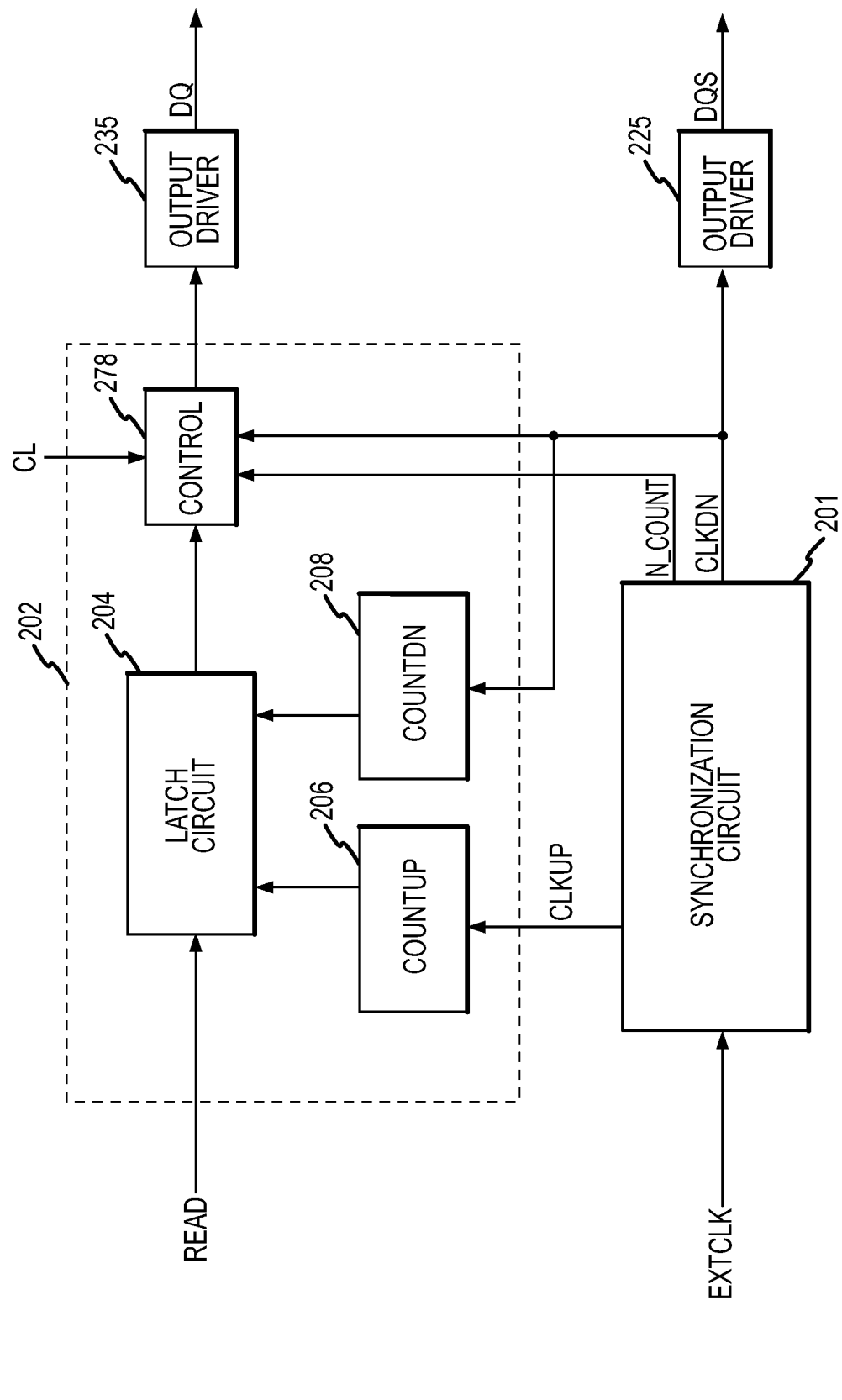
FIG. 2 is a block diagram of a DLL circuit with read latency control according to an embodiment of the invention.

FIG. 2 shows a block diagram of a read latency control system 200 that includes a synchronization circuit 201 configured to provide various signals to a read latency control circuit 202 for synchronizing a read operation with an external clock signal. The synchronization circuit 201 may be a delay locked loop, phase locked loop or another clock management circuit in a synchronous integrated circuit, which are well-known in the art. In one embodiment, the synchronization circuit 201 may be used to generate internal clock signals relative to a received external clock signal EXTCLK to which read data is latched and synchronized in a memory device. The synchronization circuit 201 generates an upstream clock signal CLKUP from the EXTCLK signal and a downstream clock signal CLKDN having a timing relationship relative to the CLKUP signal. The CLKUP signal and the CLKDN signal are applied to the read latency control circuit 202 and used to track internal read clock pulses relative to the EXTCLK signal during a memory read operation. More specifically, the CLKUP and CLKDN signals are used by the read latency control circuit 202 to count the number of clock cycles that are calculated to meet a specified read latency CL for latching the read data. A count signal N_count is provided to the read latency control circuit 202 by the synchronization circuit 201 after the external and internal clocks are synchronized through a series of delay elements. The N_count signal may be a count of the number of clock cycles calculated by the synchronization circuit 201 to achieve the locking condition. An embodiment for calculating the N_count and generating an N_count signal is described in detail in a commonly assigned patent application Ser. No. 11/612,798 (filing date Dec. 19, 2006) entitled TIMING SYNCHRONIZATION CIRCUIT WITH LOOP COUNTER, and is hereby incorporated by reference. The synchronization circuit 201 provides the CLKDN signal to an output driver 225 that generates a read clock signal DQS whose phase is matched to the phase of the EXTCLK signal. By relying on the synchronization circuit 201 for timing signals, the read latency control system 200 eliminates the need for additional circuitry, such as the slave delay circuit 124 of FIG. 1.

As previously explained, the specified read latency CL must be met when read data is accessed from the memory device during a read operation. The specified latency CL is conventionally in the form of a number of clock cycles and may be fixed in the memory device at the time of manufacture or may be a value from an external memory controller (not shown) as part of a command signal and programmed into a mode register (also not shown) in a separate location in the memory device. During a read operation, the read latency control circuit 202 receives a read command signal READ, and upon receiving the CLKUP and the CLKDN signals respectively, the read latency control circuit 202 matches the timing of the READ signal to the internal clock signals of the synchronization circuit 201. The READ signal is initially received by a latch circuit 204 when a countup counter 206 is enabled by the CLKUP signal. The latched READ signal is passed on to a control circuit 278 when a countdn counter 208 is enabled by the CLKDN signal. In response to receiving the combination of the READ signal from the latch circuit 204, the CL signal from the mode register (not shown), and the N_count signal from the synchronization circuit 201, the control circuit 278 synchronizes the READ signal the DQS signal. As a result, the latched read data (not shown) is provided to an output driver 235 and passed on to an output terminal DQ pad 329 (shown in FIG. 3) as data DQ relative to the timing of the DQS signal, and as required by the specified latency CL. Additional delay models that unnecessarily consume extra chip space are thereby reduced by utilizing the CLKUP and CLKDN signals that can be provided directly to the read latency control circuit 202 by the synchronization circuit 201. High speed operations are thus better achieved by utilizing a clock-based control system such as the read latency control system 200.

Figure 3:
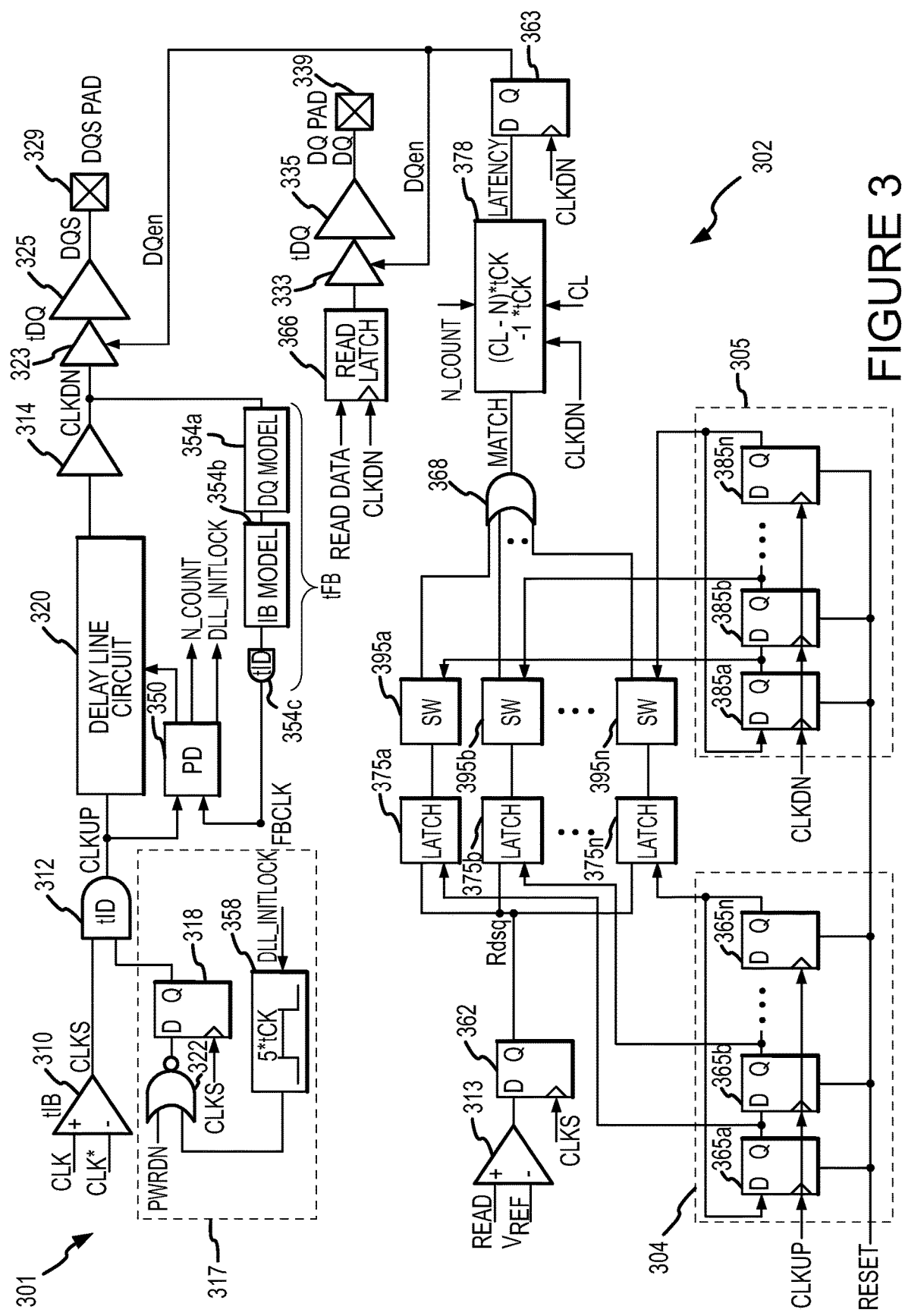
FIG. 3 is a block diagram of a DLL circuit configured to provide various signals to a read latency control circuit according to another embodiment of the invention.

Embodiments of the synchronization circuit 201 and read latency control circuit 202 are shown in further detail in FIG. 3. With respect to the synchronization circuit, complimentary external clock signal CLK and CLK* signals are applied to an input buffer 310 of a delay locked loop 301 ("DLL"). The input buffer 310 applies a buffered external clock signal CLKS to one of two inputs of a NAND gate tID 312. A second input to the tID gate 312 will be described further in the context of describing an initialization mode circuit 317 that provides the second input. After evaluating its two inputs, the tID gate 312 outputs an upstream CLKUP signal that is applied to a delay line circuit 320. The delay line circuit 320 delays the received CLKUP signal based on a control signal from a phase detector 350, and an output buffer 314 drives the output of the delay line circuit 320 as a downstream signal CLKDN to output drivers 323, 325. The CLKDN signal is eventually passed on as the output signal DQS to the output bus through DQS pad 329 after locking is achieved. The output of the delay line circuit 320 is connected to a feedback loop that returns the signal to the phase detector 350 where a phase difference-related signal that controls one or more delay lines of the delay line circuit 320 is generated by the phase detector 350 and applied to the delay line circuit 320.

In the feedback loop, the CLKDN signal is fed through a series of model delay circuits 354 to generate a delayed feedback signal FBCLK at the output of the model tID gate 354c. The FBCLK signal includes the delays applied to the CLKDN signal that is approximately equal to the propagation delays due to the input buffer 310, the tID gate 312, and the output drivers 323, 325 so that the delays applied to the external clock signal as it propagates through the DLL circuit 301 are compensated for as the locking condition is achieved. The phase detector 350 compares the FBCLK signal and the received CLKUP signal to generate a control signal that either advances or delays the timing of the received CLKUP signal such that its phase is matched to the phase of the FBCLK signal. The CLKDN signal may be returned through the feedback loop again to determine whether a locking condition has been met or to make further phase adjustments. The phase detector 350 additionally generates an N_count signal representing a count of the number of clock cycles used to adjust the received input signal in order to achieve the phase-locked condition.

The phase detector 350 also generates a clock hold signal DLL_initlock that enables the initialization mode circuit 317 to temporarily lock the delay line circuit 320 causing it to temporarily stop toggling for a predetermined number of clock periods. The DLL_initlock signal is initially applied to a delay line lock control circuit 358 that provides a high control signal to a NOR gate 322. The second input to the NOR gate 322 is a constant low signal powerdn. The high control signal causes the NOR gate 322 to provide a low input signal to a flip-flop 318 whose output provides the second input to the tID gate 312 relative to the rising edge of the CLKS signal. When the second input of the tID gate 312 is low, due to the logic circuit 358 receiving the DLL_initlock signal, the delay line 320 temporarily stops for five clock cycles, as will be further described later. Otherwise, the second input of the tID gate 312 is defaulted to be high during normal operation, in which case the CLKS signal is permitted to pass through to the delay line circuit 320.

As discussed above, FIG. 3 also shows an embodiment of a read latency control circuit 302 in greater detail, which may be used as the read latency control circuit 202 in FIG. 2. The read latency control circuit 302 is enabled when a read command signal READ is received by one input of a command input buffer 313 during a read operation. A $V_{REF}$ signal is applied to the second input of the command buffer 313 to which the READ signal is compared. If the READ signal is greater than $V_{REF}$ a high logic signal is buffered out and applied to a flip-flop 362, which is clocked by the same CLKS signal as the flip-flop 318 of the DLL circuit 301. In response to the rising edge of the CLKS signal, the flip-flop 362 outputs a read command logic signal RDSQ. At that instance, the RDSQ signal is received by whichever one of a set of latches 375 is first enabled to receive the command signal.

Each latch 375 is correspondingly coupled to one of a set of flip-flops 365 of an upstream ring counter 304. The inputs and outputs of the flip-flops 365 are coupled together in series with the output of the last flip-flop 365n being coupled to the input of the first flip-flop 365a. Each of the outputs is additionally coupled to a corresponding latch 375. For example, the output of the flip-flop 365a is coupled to the input of the latch 375a, the output of the flip-flop 365b is coupled to the input of the latch 375b, and so on. If the read latency control circuit 302 includes N number of latches 375, the upstream ring counter 304 will also include N number of flip-flops 365. The output of each flip-flop 365 is initially reset to low before operation, except the last flip-flop 365n, which is initially reset to high. The flip-flops 365 are clocked by the CLKUP signal from the DLL circuit 301, and on the first rising edge of the CLKUP signal, the high output of the last flip-flop 365n is received by the input of the first flip-flop 365a, while all other flip-flops 365b-n receive the low signal from the preceding outputs. On the second rising edge, the output of the first flip-flop 365a provides its high input to the second flip-flop 365b while all other flip-flops receive low input signals. The first flip-flop 365a additionally provides a high enable signal to the latch 375a, which allows the latch 375a to receive the RDSQ signal if available. On the third rising edge of the CLKUP signal, the second flip-flop 365b provides a high input to the third flip-flop 365c, which then enables the latch 375c to receive the RDSQ signal if available. In this manner only one latch 375 is enabled at one time to receive the RDQS signal, and each latch 375 is enabled in sequential order with respect to the flip-flops 365 of the upstream ring counter 304 thereby each latch 375 takes a turn in receiving a high enable signal which allows one of the latches 375 to capture the RDSQ signal relative to the CLKUP signal.

Each latch 375 is also coupled to a respective switch 395 that controls when the latched RDSQ signal is propagated through to an OR gate 368. If there are N latches 375, then there are also N number of switches 395. Similar to the latches 375, each of the switches 395 are controlled by a respectively coupled flip-flop 385 in a downstream ring counter 305. The downstream ring counter 305 includes the same number of flip-flops 385 as there are switches 395. The downstream ring counter 305 functions in the same manner as the upstream counter 304, except that the downstream ring counter 305 is clocked by the CLKDN signal from the DLL circuit 301. Therefore, the first available latch 375 holding the RDSQ signal is pass through to the OR gate 368 by the first enabled switch 395 relative to the CLKDN signal, which is controlled by the downstream ring counter 305 clocked by the CLKDN signal.

When the OR gate 368 determines a match between the latch 375 storing the RDSQ signal and the enabled switch 395, a MATCH signal is generated and provided to a latency circuit 378, which also receives a predetermined specified latency signal from a mode register (not shown) as previously described. The latency circuit 378 additionally receives the N_count signal from the phase detector 350 of the DLL circuit 301. When receiving the combination of the CL, N_count and MATCH signals, the latency circuit 378 generates a LATENCY signal having a delay relative to the CLKDN signal. The LATENCY signal is latched by a flip-flop 363 that is also clocked by the CLKDN signal, and the flip-flop 363 generates an enable signal DQen, to enable pre-output and output drivers 323, 325, 333, 335 of both the DLL circuit 301 and the read latency control circuit 302. The pre-output driver 333 is further coupled to a read latch 366 that latches read data from a memory array (not shown) in response to a memory request. The DQen signal thus enables the pre-output driver 333 to drive the latched read data through an output driver 335 to an output terminal DQ pad 339 relative to the CLKDN signal. At the same time, the DQen signal enables the pre-output driver 323 to drive the CLKDN signal through the output driver 325 to apply the DQS signal to the DQS pad 329. For purposes of matching timing variations, the output drivers 323, 325 are configured in the same manner as the output drivers 333, 335.

In summary, the DLL circuit 301 and the read latency control circuit 302 simultaneously work together to synchronize the DQ data (being applied on the DQ pad 339) with the DQS signal (being applied on the DQS pad 329) as required by the read latency signal CL. As previously described, the operation of the read latency control circuit 302 is initiated upon receiving the READ command signal and latched to one of the latches 375 that is enabled by the upstream ring counter 304 clocked by the CLKUP signal. The CLKDN signal, which is used to generate the DQS signal by the DLL circuit 301, is also utilized by the downstream ring counter 305 to timely enable the switch 395 that corresponds to the latch 375 holding the RDSQ signal. When the OR gate 368 determines a match between the latch 375 and the switch 395, indicating a read request is in queue, the latency circuit 378 generates the LATENCY control signal that determines when to provide the read data from the memory array captured in the read latch 366. The LATENCY control signal is calculated based on values representing the specified read latency CL, the N_count from the phase detector 350, and the MATCH signal from the OR gate 368, all relative to the CLKDN signal. When the flip-flop 363 receives the LATENCY signal, the flip-flop 363 generates the DQen signal, which enables the pre-output driver 333 to pass on the read data to the DQ pad 339 from the read latch 366 relative to the CLKDN signal. The pre-output driver 323 simultaneously receives the DQen signal to drive the CLKDN signal from the delay line circuit 320 to drive the DQS signal to the DQS pad 329 as the DQ data is driven to the DQ pad 339.

The DLL_initlock signal is generated by the phase detector 350 and applied to the delay line lock circuit 358 of the initialization mode circuit 317 such that the flip-flops 318, 362 are synchronized by the same CLKS signal that starts the synchronization operation of the read latency control circuit 302. Since the CLKUP and CLKDN signals of the DLL circuit 302 are free running clocks, the initialization mode circuit 317 allows the read latency control circuit 302 to determine which of the clocks is first. In response to the DLL_initlock signal, the initialization mode circuit 317 locks the delay line circuit 320 for a predetermined number of clock cycles. For example, if the initialization mode circuit 317 is programmed for 5*tCK, the delay line circuit 320 waits five clock cycles and then starts toggling again. Therefore, the first received signal from the DLL circuit 302 is the CLKUP signal, since the CLKDN signal is delayed relative to the CLKUP signal. Additionally, prior to the DLL_initlock signal being received by the control circuit 358, the ring counters 304, 305 are reset by a RESET signal. Therefore, by receiving the DLL_initlock signal, the initialization mode circuit 317 also knows that the ring counters 304, 305 have been reset and are ready to receive the CLKUP and CLKDN signals, respectively.

The required specified read latency is matched by the design of the read latency control circuit 302 such that the sum of delays between the READ signal input of command input buffer 313 to the DQ pad 339 yields the specified read latency value. Since the READ signal is latched by the flip-flop 362 being clocked by the CLKS signal and the MATCH signal is generated relative to the CLKDN signal, the pathway between the command input buffer 313 and the OR gate 368 is designed to have the same delay variations as the EXTCLK-to-CLKDN pathway between the input buffer 310 to the output buffer 314 of the DLL circuit 301 for generating the CLKDN signal. The EXTCLK-to-CLKDN pathway is equal to tIB+tID+(N*tCK-tFB), where tIB is the propagation delay due to the input buffer 310 and the tID is the propagation delay due to the tID gate 312. The N represents the N_count delay calculation and tCK is the clock period. As previously described, the N_count is the number of clock cycles calculated by the phase detector 350 in the synchronization circuit 301 to achieve the locking condition. The entire closed loop delay, from the output of the tID gate 312 (the CLKUP node) to the output of the model tID gate 354c (the FBCLK node) is always N*tCK after locking has been established. The tFB represents the propagation delays of the feedback loop (tFB=tID+tIB+tDQ). The remaining pathway of the read latency control circuit 302 (from the output of the OR gate 368 to the DQ pad 339) is designed to equal ((CL−N)*tCK−1*tCK)+1*tCK+tDQ, where (CL−N)*tCK−1*tCK is the delay calculated by the latency circuit 378. The 1*tCK is the propagation delay due to the flip-flop 363, and the tDQ is the propagation delay due to the output drivers 333, 335. The sum of the delays for two pathways determines the delay between the command input buffer 313 to the DQ pad 339, which equals CL*tCK, resulting in the calculation for CL, the predetermined read latency value.

Figure 4:
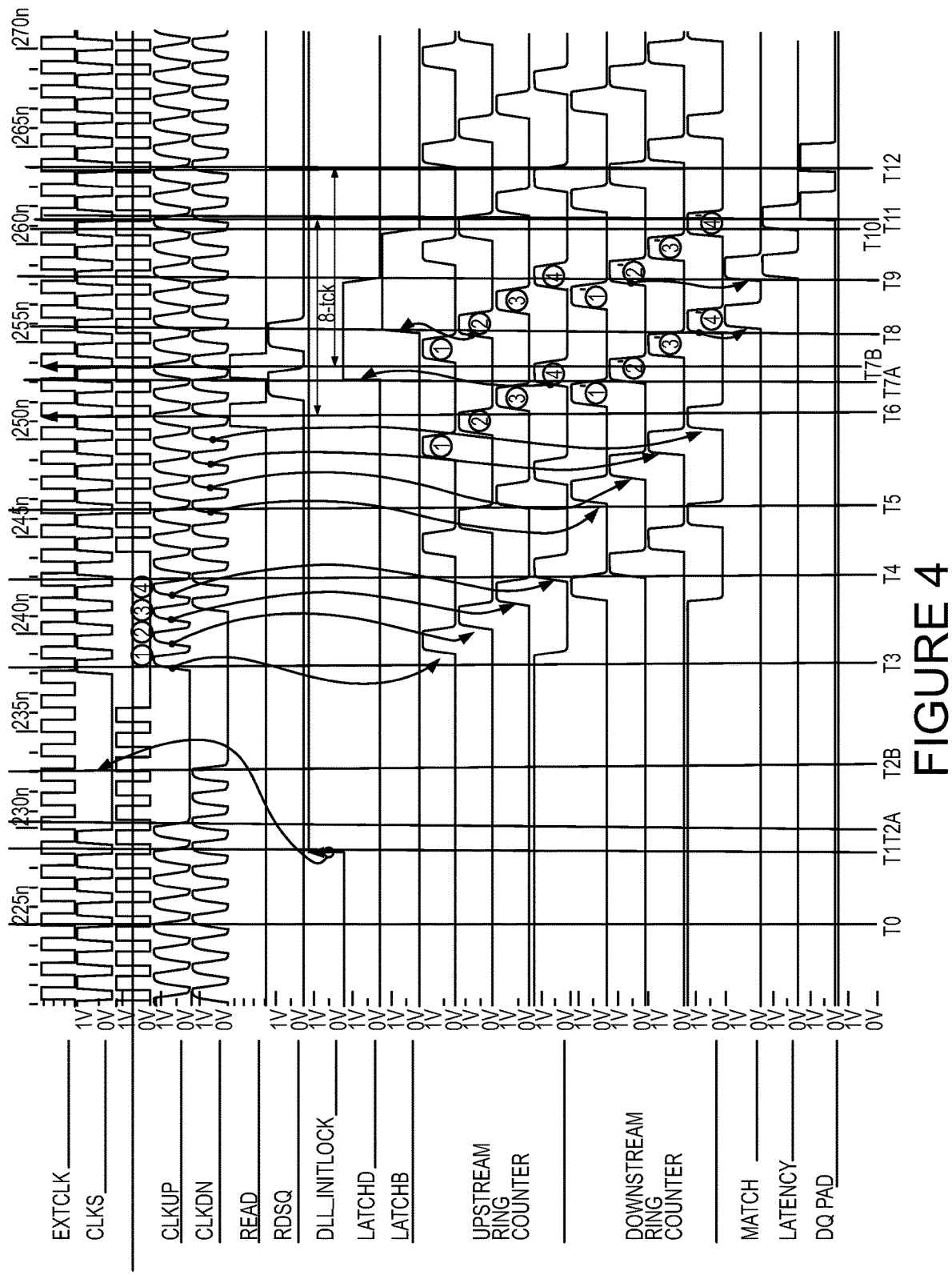
FIG. 4 is a timing diagram of various signals during operation of the DLL circuit according to an embodiment of the invention of FIG. 3.

A timing diagram summarizing the clock signals of the read latency control circuit 302 of FIG. 3 is shown in FIG. 4. At time T0, the CLKS signal is generated by the DLL circuit 301 in response to receiving the EXTCLK signal, from which the CLKUP and CLKDN signals are also generated. At time T1, the DLL_initlock provided to the initialization mode circuit 317 transitions from low to high to lock the delay line circuit 320 and cause the input clock CLKS to stop toggling for a predetermined time of five clock cycles, shown at time T2A. Also at time T2A, the CLKUP signal is subsequently locked for five clock cycles, followed by the CLKDN signal being locked for five clock cycles at time T2B. As previously described, since the CLKUP and CLKDN are free-running clocks, it is difficult for the read latency control circuit 302 to determine the leading clock signal. After a five clock cycle hold, the CLKUP signal first resumes toggling at time T3, and the upstream ring counter 304 begins to sequentially enable each latch 375 one at a time between times T3 to T4. After some delay, the downstream ring counter 304 begins to sequentially enable each switch 395 one at a time between times T5 to T6. The first read command signal is received and detected as a high signal by the command input buffer 313 at time T6, and the RDSQ signal is latched by the fourth latch 375d, which is coincidentally the latch that is enabled by the upstream ring counter 304 at time T7A. A second READ command signal is received at time T7B, which is latched by the next enabled latch 375b at time T8. Also at time T8, the switch 395d coupled to the fourth latch 375d is enabled by the downstream ring counter 305 and a first MATCH signal is generated corresponding to the first received READ command signal. At the next available rising edge of the CLKDN signal, the downstream ring counter 305 enables the switch 395b corresponding to the latch 375b holding the second received READ signal, and a second MATCH signal is generated at time T9. The first and second MATCH signals are received in order by the latency circuit 378, and first and second LATENCY signals are generated in that order at times T9 and T10, respectively. In response, read data corresponding to the first READ signal is applied to the DQ pad 339 at time T11 and the read data corresponding to the second READ signal is applied to the DQ pad 339 at time T12. For the example shown in FIG. 4, the read latency value CL is predetermined and provided by either an external controller or a mode register as previously described, and is set to equal 8. Therefore, the read latency count for the first READ signal is shown as eight clock cycle from the time the READ signal is received at time T6 to the time the first read data is applied on the DQ pad 339 at time T11. As a result, the specified read latency has been met. The read latency count for the second READ signal is similarly indicated between times T7B and T12.

Figure 5:
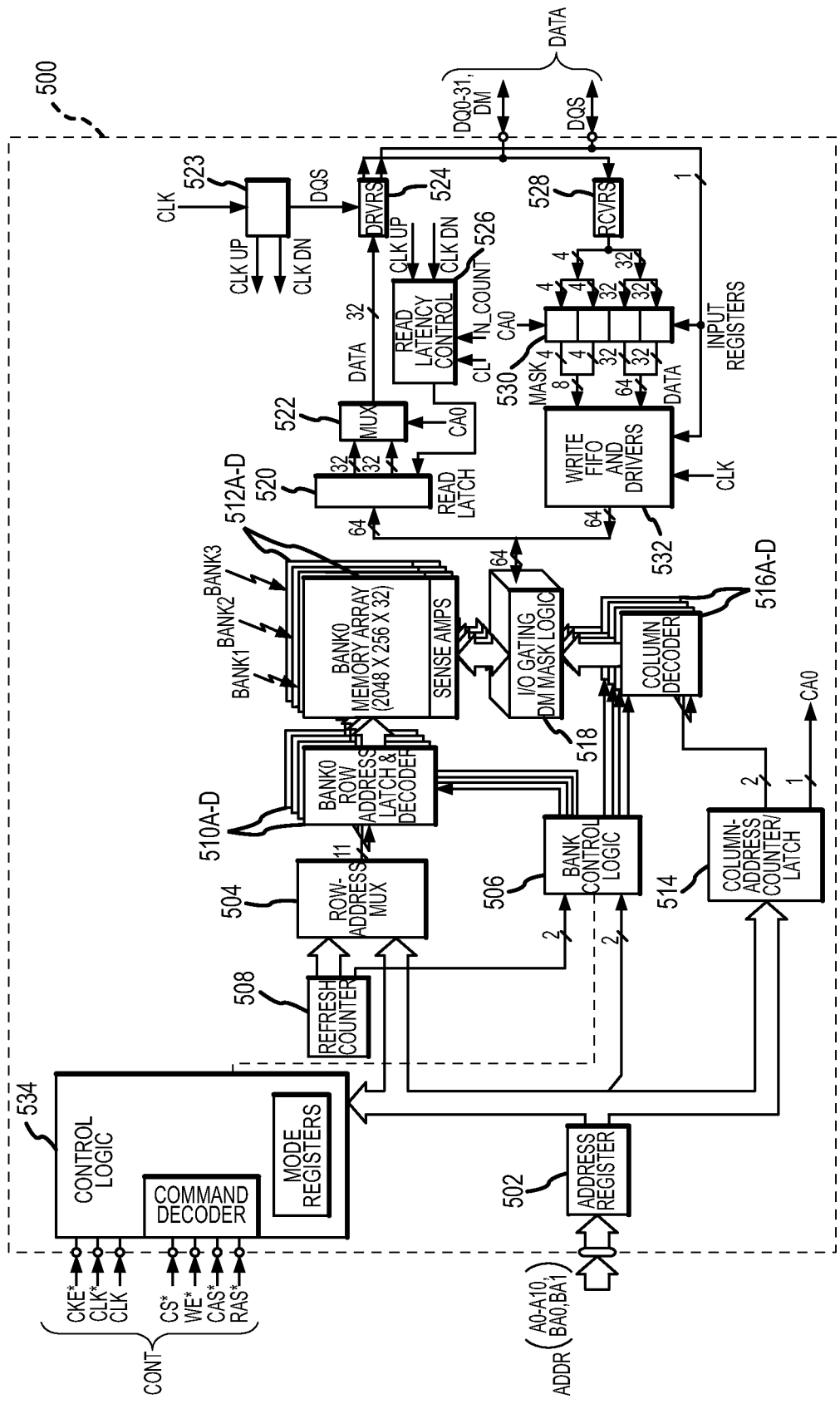
FIG. 5 is a functional block diagram illustrating a memory device that includes a DLL circuit according to an embodiment of the invention.

FIG. 5 is a functional block diagram of an embodiment of a memory device 500 that includes the DLL circuit 301 and the read latency control circuit 302 of FIG. 3 or a DLL circuit and read latency control circuit according to another embodiment of the invention. The memory device 500 in FIG. 5 is a double-data rate ("DDR") SDRAM, although the principles described herein are applicable to any memory device that may include a circuit for synchronizing internal and external signals, such as conventional SDRAMs, as well as packetized memory devices like SLDRAMs and RDRAMs, and are equally applicable to any integrated circuit that must synchronize internal and external clocking signals.

The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A-D. The bank control logic 506 activates the row address latch and decoder 510A-D corresponding to either the bank address received from the address register 502 or a refresh bank address from the refresh counter 508, and the activated row address latch and decoder latches and decodes the received row address. In response to the decoded row address, the activated row address latch and decoder 510A-D applies various signals to a corresponding memory bank 512A-D to thereby activate a row of memory cells corresponding to the decoded row address. Each memory bank 512A-D includes a memory-cell array having a plurality of memory cells arranged in rows and columns, and the data stored in the memory cells in the activated row is stored in sense amplifiers in the corresponding memory bank. The row address multiplexer 504 applies the refresh row address from the refresh counter 508 to the decoders 510A-D and the bank control logic circuit 506 uses the refresh bank address from the refresh counter when the memory device 500 operates in an auto-refresh or self-refresh mode of operation in response to an auto- or self-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. Depending on the operating mode of the memory device 500, the column address counter and latch 514 either directly applies the latched column address to the decoders 516A-D, or applies a sequence of column addresses to the decoders starting at the column address provided by the address register 502. In response to the column address from the counter and latch 514, the activated column decoder 516A-D applies decode and control signals to an I/O gating and data masking circuit 518 which, in turn, accesses memory cells corresponding to the decoded column address in the activated row of memory cells in the memory bank 512A-D being accessed.

During data read operations, data being read from the addressed memory cells is coupled through the I/O gating and data masking circuit 518 to a read latch 520. The I/O gating and data masking circuit 518 supplies N bits of data to the read latch 520, which then applies two N/2 bit words to a multiplexer 522. The circuit 518 provides 64 bits to the read latch 520 which, in turn, provides two 32 bits words to the multiplexer 522. A data driver 524 sequentially receives the N/2 bit words from the multiplexer 522 and also receives a data signal DQS from the clock generator 523. A read latency control circuit 526 is additional coupled to the read latch 520, and receives internal clock signals CLKUP and CLKDN from the clock generator 523. The DQS signal is used by an external circuit such as a memory controller (not shown) in latching data from the memory device 500 during read operations. As previously described, the read latency control circuit 526 controls the read latch 520 to synchronize the read data output relative to the DQS signal such that a specified read latency is met. In response to the DQS signal and a LATENCY control signal provided by the read latency control circuit 526, the data driver 524 sequentially outputs the received N/2 bits words as a corresponding data word DQ, each data word being output in synchronism with rising or falling edges of the CLK signal that is applied to clock the memory device 500. The data driver 524 also outputs the data clock signal DQS in synchronism with rising or falling edges of the CLK signal. Each data word DQ and the data clock signal DQS collectively define a data bus DATA. As will be appreciated by those skilled in the art, the data clock signal DQS is a delayed version of the CLK signal, and the clock generator 523 adjusts the DQS signal relative to the CLK signal to ensure that the DQS signal and the DQ words are placed on the DATA bus in synchronism with the CLK signal, as previously described. The DATA bus also includes masking signals DM0-M, which will be described in more detail below with reference to data write operations.

During data write operations, an external circuit such as a memory controller (not shown) applies N/2 bit data words DQ, the DQS signal, and corresponding data masking signals DM on the data bus DATA. A data receiver 528 receives each DQ word and the associated DM signals, and applies these signals to input registers 530 that are clocked by the DQS signal. In response to a rising edge of the DQS signal, the input registers 530 latch a first N/2 bit DQ word and the associated DM signals, and in response to a falling edge of the DQS signal the input registers latch the second N/2 bit DQ word and associated DM signals. The input register 530 provides the two latched N/2 bit DQ words as an N-bit word to a write FIFO and driver 532, which clocks the applied DQ word and DM signals into the write FIFO and driver in response to the DQS signal. The DQ word is clocked out of the write FIFO and driver 532 in response to the CLK signal, and is applied to the I/O gating and masking circuit 518. The I/O gating and masking circuit 518 transfers the DQ word to the addressed memory cells in the accessed bank 512A-D subject to the DM signals, which may be used to selectively mask bits or groups of bits in the DQ words (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signal CLK or the combination of clock signals CLK, CLK*, the command decoder 534 latches and decodes an applied command, and generates a sequence of clocking and control signals that control the components 502-532 to execute the function of the applied command. The clock enable signal CKE enables clocking of the command decoder 534 by the clock signal CLK or clock signals CLK, CLK*. The command decoder 534 latches command and address signals at edges of the CLK signal or CLK and CLK* signals (i.e., the crossing point of CLK going high and CLK* going low), while the input registers 530 and data drivers 524 transfer data into and from, respectively, the memory device 500 in response to the edges of the data strobe signal DQS and thus at the frequency of the clock signal CLK or clock signals CLK, CLK*. This is true because the DQS signal has the same frequency as the clock signals. The memory device 500 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 534 in generating the control and timing signals is conventional, and thus, for the sake of brevity, will not be described in more detail.

Figure 6:
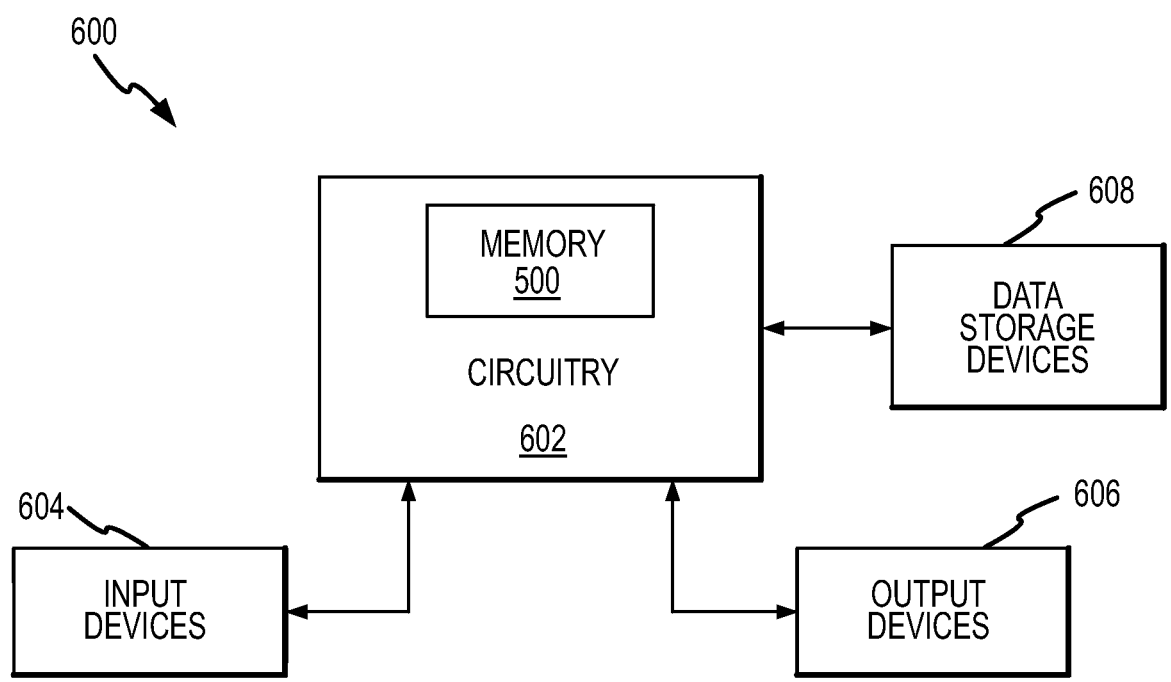
FIG. 6 is a functional block diagram illustrating a computer system including the memory device of FIG. 5.

FIG. 6 is a block diagram of an embodiment of a processor-based system 600 including processor circuitry 602, which includes the memory device 500 of FIG. 5 or a memory device according to some other embodiment of the invention. Conventionally, the processor circuitry 602 is coupled through address, data, and control buses to the memory device 500 to provide for writing data to and reading data from the memory device 500. The processor circuitry 602 includes circuitry for performing various processing functions, such as executing specific software to perform specific calculations or tasks. In addition, the processor-based system 600 includes one or more input devices 604, such as a keyboard or a mouse, coupled to the processor circuitry 602 to allow an operator to interface with the processor-based system 600. Typically, the processor-based system 600 also includes one or more output devices 606 coupled to the processor circuitry 602, such as output devices typically including a printer and a video terminal. One or more data storage devices 608 are also typically coupled to the processor circuitry 602 to store data or retrieve data from external storage media (not shown). Examples of typical storage devices 608 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the embodiments of the invention. For example, many of the components described above may be implemented using either digital or analog circuitry, or a combination of both.

What is claimed is:

1. An apparatus, comprising:
   a synchronization circuit configured to receive a first clock signal, and provide a second clock signal based, at least in part, on the first clock signal;
   a mode register configured to store a latency value indicative of a first number of clock cycles; and
   a latency control circuit coupled to the synchronization circuit and the mode register, the latency control circuit configured to receive the first clock signal, the second clock signal, the latency value, a count signal indicative of a second number of clock cycles, and a command signal, wherein the count signal is different than the latency value;
   wherein the latency control circuit is further configured to latch the command signal responsive, at least in part, to the first clock signal to provide a latched command signal, hold the latched command signal for an amount of time based, at least in part, on the latency value, and provide the latched command signal responsive, at least in part, to the second clock signal.

2. The device of claim 1, wherein the latency control circuit includes a latch circuit configured to latch the command signal responsive, at least in part, to the first clock signal.

3. The device of claim 2, wherein the latency control circuit includes a latency circuit configured to provide the latched command signal based on an occurrence of one or more specified clock cycles after receiving the command signal, wherein the one or more specified clock signals is based on the latency value indicative of the first number of clock cycles and the count signal indicative of the second number of clock cycles.

4. The device of claim 3, wherein the latency control circuit is configured to count a number of the one or more specified clock cycles based on the second clock signal and the count signal indicative of the second number of clock cycles.

5. The device of claim 3, wherein the latency control circuit includes an additional latch circuit configured to latch the latched command signal responsive, at least in part, to the second clock signal.

6. The device of claim 1, further comprising a memory array and a data output driver configured to provide read data from the memory array responsive, at least in part, to the latched command signal provided by the latency control circuit.

7. The device of claim 1, further comprising a data strobe output driver configured to provide a data strobe signal based on the second clock signal responsive, at least in part, to the latched command signal provided by the latency control circuit.

8. The device of claim 1, further comprising an initialization mode circuit configured to prevent the synchronization circuit from being provided with the first clock signal in a power down mode.

9. A method comprising:
receiving a first clock signal;
delaying a second clock signal a first delay amount to provide a third clock signal;
detecting a phase difference between the third clock signal and the first clock signal to provide a count signal indicative of a first number of clock cycles;
adjusting a second delay amount of a delay line responsive, at least in part, to the count signal;
providing the second clock signal based, at least in part, on the first clock signal, wherein the second clock signal is provided by delaying the first clock signal the second delay amount;
receiving a command signal;
latching the command signal responsive, at least in part, to the first clock signal; and
providing the latched command signal responsive, at least in part, to the second clock signal with a latency delay indicative of a second number of clock cycles, wherein providing the latched command signal is based partly on latency delay and the count signal.

10. The method of claim 9, further comprising providing memory cell data responsive to the latched command signal, wherein the latched command signal is provided responsive, at least in part, to the second clock signal.

11. The method of claim 9, further comprising providing a data strobe signal responsive to the latched command signal, wherein the latched command signal is provided responsive, at least in part, to the second clock signal.

12. The method of claim 11, wherein providing the data strobe signal responsive, at least in part, to the second clock signal further comprises enabling a pre-output driver based on a latency signal, wherein the pre-output driver provides the data strobe signal.

13. The method of claim 9, wherein providing the latched command signal comprises holding the latched command signal for an amount of time based, at least in part, on a latency value, and providing the latched command signal responsive, at least in part, to the second clock signal.

14. The method of claim 9, further comprising disabling the first clock signal responsive to a power down mode.

15. The method of claim 9, wherein the latency value is different than the count signal.

* * * * *